US009966298B2

(12) United States Patent
Holmes et al.

(10) Patent No.: US 9,966,298 B2
(45) Date of Patent: May 8, 2018

(54) MULTIPLE-STAGE PROCESSING DEVICES

(71) Applicant: Cleaning Technologies Group, LLC, Cincinnati, OH (US)

(72) Inventors: Phillip Holmes, Hamilton, OH (US); Jeffrey Mills, Loveland, OH (US)

(73) Assignee: Cleaning Technologies Group, LLC, Cincinnati, OH (US)

( * ) Notice: Subject to any disclaimer, the term of this patent is extended or adjusted under 35 U.S.C. 154(b) by 685 days.

(21) Appl. No.: 14/470,207

(22) Filed: Aug. 27, 2014

(65) Prior Publication Data

US 2015/0059811 A1    Mar. 5, 2015

Related U.S. Application Data

(60) Provisional application No. 61/870,580, filed on Aug. 27, 2013.

(51) Int. Cl.
| | |
|---|---|
| *B08B 3/02* | (2006.01) |
| *H01L 21/687* | (2006.01) |
| *H01L 21/677* | (2006.01) |
| *B23Q 16/02* | (2006.01) |

(52) U.S. Cl.
CPC ........ *H01L 21/68764* (2013.01); *B08B 3/022* (2013.01); *B23Q 16/025* (2013.01); *H01L 21/67703* (2013.01); *Y10T 74/14* (2015.01)

(58) Field of Classification Search
CPC ............. H01L 21/677; H01L 21/67703; H01L 21/68764; H01L 21/68771; H01L 21/67706; H01L 21/687; H01L 21/68714; B23Q 16/025; B08B 3/02; B08B 3/022
USPC ................................................. 134/140, 142
See application file for complete search history.

(56) References Cited

U.S. PATENT DOCUMENTS

| | | | | | |
|---|---|---|---|---|---|
| 2,832,461 | A | * | 4/1958 | Evans | B08B 3/022 198/378 |
| 5,357,645 | A | * | 10/1994 | Onodera | B08B 1/04 134/83 |
| 5,666,985 | A | * | 9/1997 | Smith, Jr. | B08B 3/02 134/102.2 |
| 6,276,374 | B1 | * | 8/2001 | Wilson | B08B 3/02 134/142 |

(Continued)

*Primary Examiner* — Joseph L. Perrin
*Assistant Examiner* — Kevin G Lee
(74) *Attorney, Agent, or Firm* — Dinsmore & Shohl LLP

(57) ABSTRACT

A multiple stage processing device having a plurality of radial stages, each individual radial stage is positioned between adjacent dividing walls and indexable though a plurality of processing stations. A plurality of fixture mount assemblies are positioned on an actuation surface of the rotatable indexing assembly, each individual fixture mount assembly is associated with and mechanically coupled to an individual radial stage. One or more slotted drive hubs communicatively coupled to independently operable drive motors are positioned adjacent to the actuation surface of the rotatable indexing assembly and are engageable with the plurality of fixture mount assemblies. When an individual fixture mount assembly is engaged with an individual slotted drive hub, an individual independently operable drive motor can independently control the individual fixture mount assembly such that the individual radial stage mechanically coupled to the individual fixture mount assembly is moveably coupled to the independently operable drive motor.

20 Claims, 8 Drawing Sheets

(56) References Cited

U.S. PATENT DOCUMENTS

2012/0028547 A1* 2/2012 Takai .................... B24B 37/042
                                                          451/41
2013/0269609 A1* 10/2013 Leeser .............. H01L 21/67703
                                                         118/719

* cited by examiner

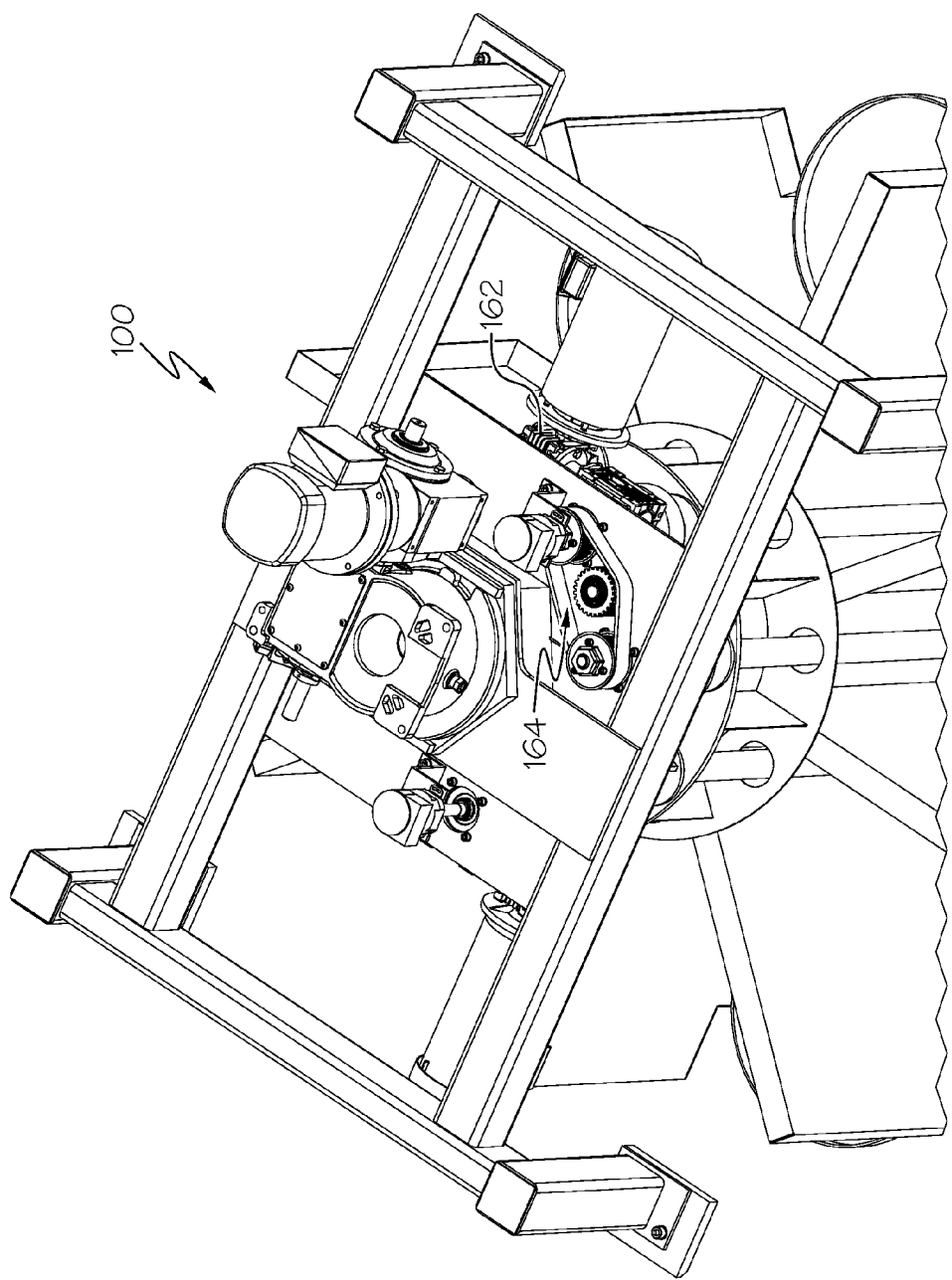

US 9,966,298 B2

MULTIPLE-STAGE PROCESSING DEVICES

RELATED APPLICATIONS

This application claims priority to U.S. Provisional Application No. 61/870,580 filed Aug. 27, 2013, the entire disclosure of which is hereby incorporated by reference.

TECHNICAL FIELD

Embodiments described herein generally relate to processing devices and, more particularly, to multiple-stage processing devices having independently controllable stages.

BACKGROUND

Washing and drying devices are used to wash and dry machine components in a variety of settings, for example, in a manufacturing facility or a warehouse. Components, such as engines, for example, may be loaded into a washing device such as a washing tank, washed, removed and dried, either by hand or in another machine. Current washing and drying machines and techniques may be time consuming and may provide imprecise cleaning.

Accordingly, a multiple stage processing device may be desired to independently and precisely wash and dry machine components within a single device.

SUMMARY

In one embodiment, a multiple stage processing device includes a rotatable indexing assembly having a plurality of dividing walls extending radially from an axis of rotation, an indexing motor communicatively coupled to the rotatable indexing assembly, and plurality of radial stages, each individual radial stage positioned between adjacent dividing walls of the plurality of dividing walls and indexable though a plurality of processing stations. The multiple stage processing device further includes a plurality of fixture mount assemblies. Each individual fixture mount assembly is positioned on an actuation surface of the rotatable indexing assembly, and each individual fixture mount assembly is associated with and mechanically coupled to an individual radial stage. Further, one or more slotted drive hubs are positioned adjacent to the actuation surface of the rotatable indexing assembly. the one or more slotted drive hubs are engageable with the plurality of fixture mount assemblies, and one or more independently operable drive motors are communicatively coupled to the one or more slotted drive hubs. When an individual fixture mount assembly is engaged with an individual slotted drive hub, the individual slotted drive hub and an individual independently operable drive motor can independently control the individual fixture mount assembly such that the individual radial stage associated with and mechanically coupled to the individual fixture mount assembly is moveably coupled to the independently operable drive motor.

In another embodiment, a multiple stage processing device includes a rotatable indexing assembly having a plurality of dividing walls extending radially from an axis of rotation, an indexing motor communicatively coupled to the rotatable indexing assembly, and a plurality of radial stages. Each individual radial stage is positioned between adjacent dividing walls of the plurality of dividing walls and is indexable though a plurality of processing stations. The plurality of processing stations include a washing station having a plurality of washing nozzles configured direct cleaning solution at the individual radial stage positioned within the washing station, and a drying station having a plurality of drying nozzles fluidly coupled to a blower configured to generate and direct air at the individual radial stage positioned within the drying station. An independently operable washing station drive motor is engageable with the plurality of radial stages such that when the individual radial stage is positioned within the washing station, the individual radial stage is communicatively coupled to the independently operable washing station drive motor. An independently operable drying station drive motor is engageable with the plurality of radial stages such that when the individual radial stage is positioned within the drying station, the individual radial stage is communicatively coupled to the independently operable drying station drive motor.

In yet another embodiment, a method of cleaning components includes loading a component onto an individual radial stage. The individual radial stage is coupled to a fixture mount assembly positioned on an actuation surface of a rotatable indexing assembly. The method further includes indexing the rotatable indexing assembly about an axis of rotation such that the individual radial stage moves to a washing station, engaging the fixture mount assembly with an individual slotted drive hub associated with the washing station and communicatively coupled to an independently operable drive motor configured to move the individual radial stage within the washing station, and washing the component positioned within the washing station. The method further includes indexing the rotatable indexing assembly about an axis of rotation such that the individual radial stage moves to a drying station, engaging the fixture mount assembly with an individual slotted drive hub associated with the drying station and communicatively coupled to an independently operable drive motor configured to move the individual radial stage within the drying station, and drying the component positioned within the drying station. The method further includes indexing the rotatable indexing assembly about an axis of rotation such that the individual radial stage moves to an unloading station, and unloading the component from the individual radial stage.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 8 is a perspective view of a top portion of the example multiple-stage processing device depicting an independently operable drive motor and a slave drive of the multiple-stage processing device depicted in FIGS. 1-3 according to one or more embodiments described and illustrated herein.

DETAILED DESCRIPTION

Embodiments of the present disclosure are directed to multiple stage processing devices comprising a rotatable indexing assembly having a plurality of radial stages that may be indexed through the multiple stage processing device to transport a component through a plurality of processing stations. For example, a component can be indexed through each processing station to wash, rinse, and dry the component. The rotatable indexing assembly includes a plurality of dividing walls and radial stages positioned therebetween which allow the component to index though each processing station without interference from adjacent processing stations. The radial stages are coupled to fixture mount assemblies engageable with one or more independently operable slotted drive hubs. The independently operable slotted drive hubs are associated with one or more stations and can be coupled to one or more independently operable drive motors to provide independent control of each independently operable slotted drive hub. The independently operable slotted drive hubs and the independently operable drive motors allow the radial stages to be independently operated at each processing station. This may increase the efficiency and effectiveness of the multiple stage processing device.

Figure 1:
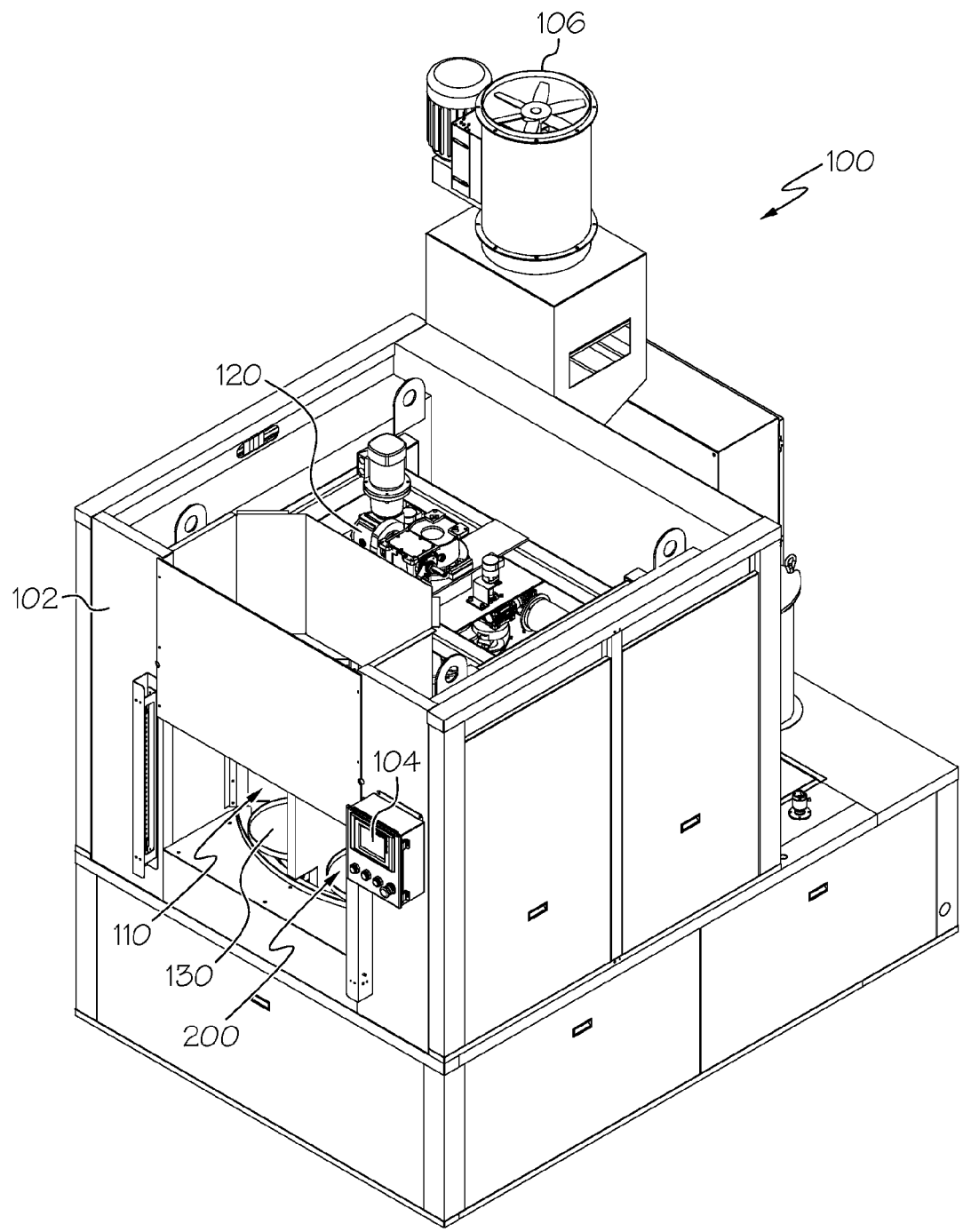
FIG. 1 is a front perspective view of an example multiple-stage processing device according to one or more embodiments described and illustrated herein.

Referring now to FIG. 1, an exemplary multiple stage processing device 100 is depicted. The multiple stage processing device 100 includes a rotatable indexing assembly 110 disposed within a cabinet enclosure 102 and communicatively coupled to an indexing motor 120. As will be described in more detail below, the rotatable indexing assembly 110 is capable of rotating in one or more directions and further comprises a plurality of radial stages 130 wherein components to be processed may be loaded, washed, rinsed, dried, and unloaded depending on which processing station 200 an individual radial stage 130 is positioned within. The components may comprise machine components such as, without limitation, engine components, transmission components, turbo charger components, and the like. It should be understood that components comprising a variety of shapes, sizes, and materials can be processed in the multiple stage processing device 100 described herein.

Referring still to FIG. 1, the cabinet enclosure 102 houses the rotatable indexing assembly 110 and a plurality of processing stations 200. As will be described in more detail below, the plurality of processing stations 200 may include a loading, unloading, washing, rinsing, drying, and vestibule stations. The cabinet enclosure 102 may also include an exhaust 106 for exhausting steam, vapor, and the like.

Referring still to FIG. 1, a control panel 104 is mounted on the cabinet enclosure 102. The control panel 104 may include electronic controls for the components of the multiple stage processing device 100 including the rotatable indexing assembly 110, the plurality of radial stages 130, and the plurality of processing stations 200. The control panel 104 may be communicatively coupled to an electronic control unit housed within or located separate from the cabinet enclosure 102. The electronic control unit may comprise a programmable logic controller (PLC), such as a SIEMENS PLC, or the like. The PLC can be configured to control each function of the multiple stage processing device 100, for example, but not limited to, indexing the rotatable indexing assembly 110 using an indexing motor 120, operating one or more slotted drive hubs 150 (FIG. 4) using independently operable drive motors 161, 162 (FIG. 4), and controlling the components of each processing station 200. The control panel 104 may further include a human machine interface (HMI) to interface with the PLC. The control panel 104 may include a plurality of selectable, preprogrammed processing operations that signal the components of the multiple stage processing device 100 to perform the movements, functions, and processes which are described in greater detail below.

Figure 2:
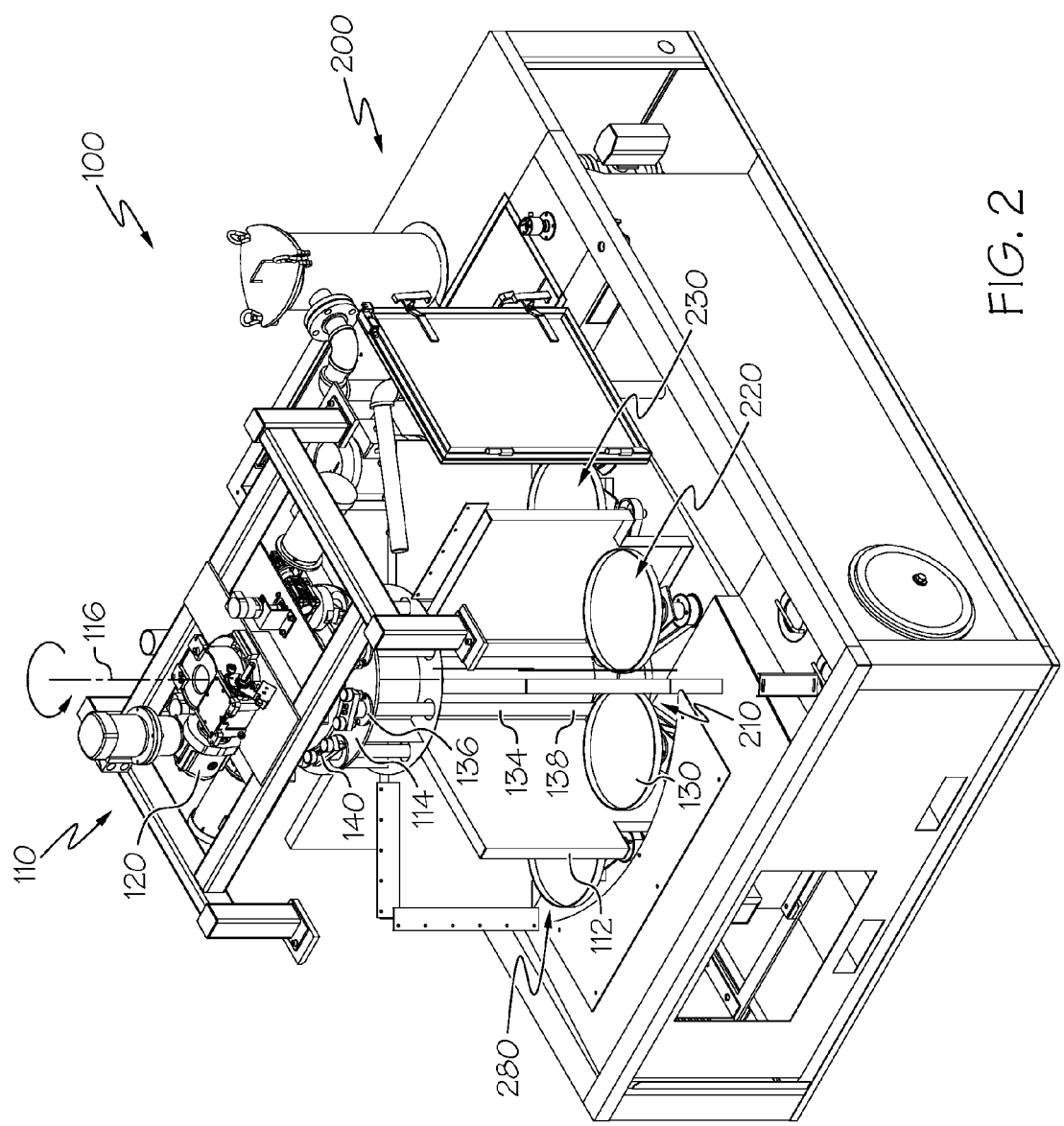
FIG. 2 a front perspective view of the example multiple-stage processing device depicted in FIG. 1 without an enclosure according to one or more embodiments described and illustrated herein.
Figure 3:
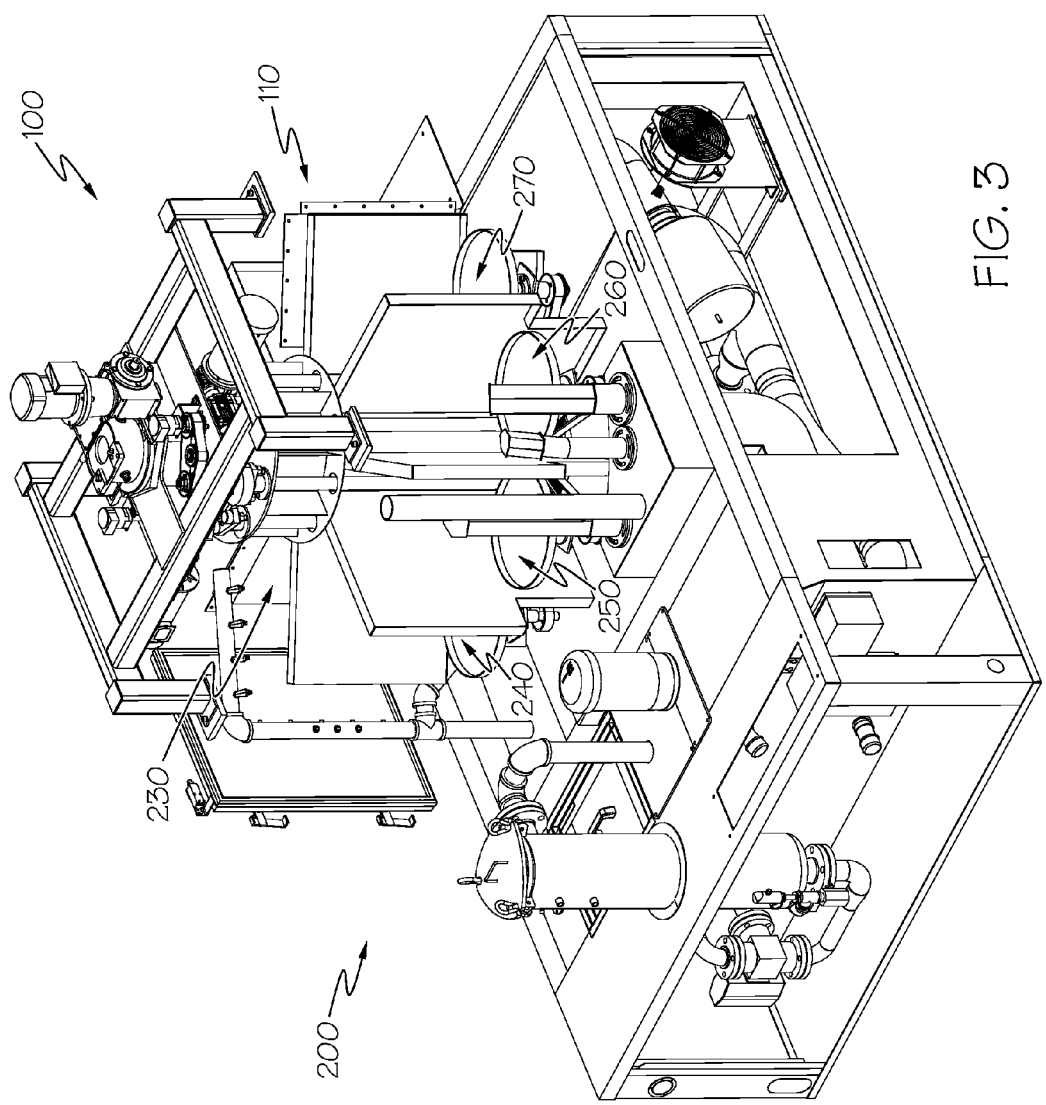
FIG. 3 is a rear perspective view of the example multiple-stage processing device depicted in FIG. 1 without the enclosure according to one or more embodiments described and illustrated herein.

Referring now to FIGS. 2 and 3, an exemplary multiple-stage processing device 100 including the rotatable indexing assembly 110 is depicted with the cabinet enclosure 102 removed for illustrative clarity. The rotatable indexing assembly 110 includes an axis of rotation 116 disposed through the center of the rotatable indexing assembly 110 and a plurality of dividing walls 112 extending radially from the axis of rotation 116. In operation, the rotatable indexing assembly 110 can rotate about the axis of rotation 116 by an indexing motor 120, which is communicatively coupled to the rotatable indexing assembly 110 and mounted above the rotatable indexing assembly 110. In alternative embodiments, the indexing motor 120 may be positioned in any location that allows mechanical communication between the rotatable indexing assembly 110 and the indexing motor 120. Further, the indexing motor 120 may comprise any exemplary motor, such as, for example, a servo motor, or a motor and clutch brake assembly. In some embodiments, a variable frequency drive controller and an encoder are communicatively coupled to the indexing motor 120. In operation, the variable frequency drive controller and the encoder can alter the rotational speed and direction of the indexing motor 120, and can track the location of each radial stage 130 mechanically coupled to the rotatable indexing assembly 110 and provide tracking information to the electronic control unit of the multiple-stage processing device 100.

Figure 4:
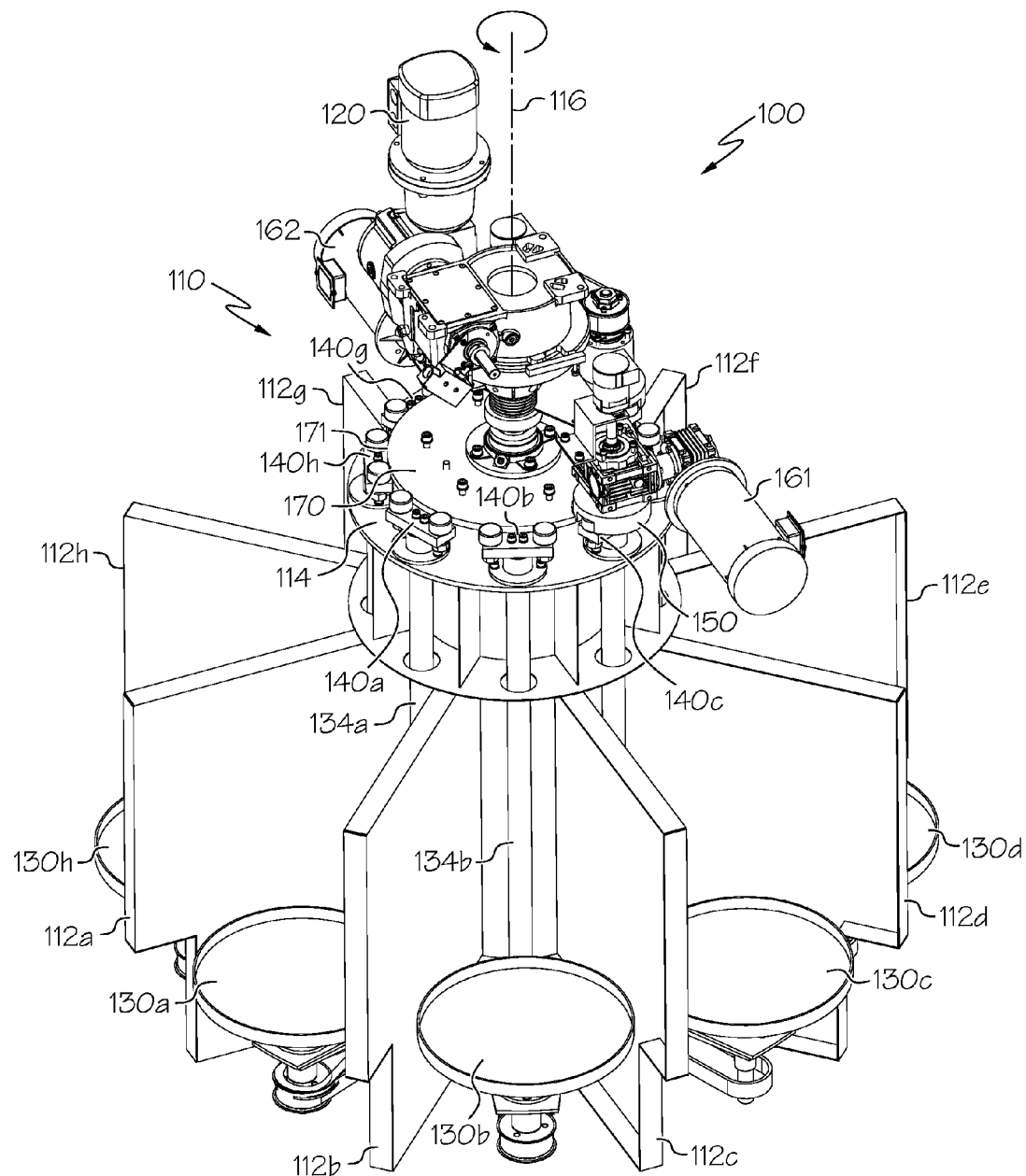
FIG. 4 is a front perspective view of a rotatable indexing assembly of the multiple-stage processing device depicted in FIGS. 1-3 according to one or more embodiments described and illustrated herein.

Referring now to FIG. 4, the multiple-stage processing device 100 further includes individual radial stages 130a-130h connected to the rotatable indexing assembly 110 and positioned between dividing walls 112a-112h. While eight radial stages 130a-130h are depicted, it should be understood that any number of radial stages 130 are contemplated, such as, for example, four, five, six, or more radial stages 130. Further, in some embodiments, the number of radial stages 130 may equal the number of dividing walls 112 such that an individual radial stage 130 is positioned between each adjacent pair of dividing walls 112 to separate the components from adjacent radial stages 130. For example, in the embodiment depicted in FIG. 4, a first radial stage 130a is positioned between a first dividing wall 112a and a second dividing wall 112b and a second radial stage 130b is positioned between a second dividing wall 112b and a third dividing wall 112c. In operation, a dividing wall 112 can isolate a component positioned, for example, in the drying station from a component positioned in the rinsing station. In other embodiments, the number of radial stages 130 may be less than the number of diving walls 112, such that there is at least one pair of adjacent dividing walls 112 with no radial stage positioned therebetween. In still other embodiments, the number of radial stages 130 may be greater than the number of dividing walls 112, such that there is at least one pair of adjacent dividing walls 112 having at least two radial stages 130 disposed therebetween.

Referring still to a FIG. 4, each individual radial stage 130a-130h is coupled to a fixture mount assembly 140a-140h which connects the individual radial stages 130a-130h to the rotatable indexing assembly 110. In some embodiments, a radial stage drive shaft 134a-134h extends between and mechanically couples each individual radial stage 130a-130h to a fixture mount assembly 140a-140h, such that movement of the fixture mount assembly 140a-140h can move an associated individual radial stage 130a-130h. As described in more detail below, during operation of the multiple stage processing device 100, each individual radial stage 130a-130h can provide a location for components to index through each processing station, allowing the components to be loaded, washed, rinsed, dried, and unloaded depending on the position of each individual radial stage 130a-130h with respect to the plurality of processing stations.

Referring still to FIG. 4, the rotatable indexing assembly 110 can further include an actuation surface 114. The actuation surface 114 can be positioned on or integral with a table or similar structure located above the plurality of dividing walls 112. The actuation surface 114 can be positioned such that the axis of rotation 116 of the rotatable indexing assembly 110 passes through the actuation surface 114, for example, through a center of the actuation surface 114. In some embodiments, the indexing motor 120 of the rotatable indexing assembly 110 can be mounted on the actuation surface 114. Further, the plurality of fixture mount assemblies 140 can be positioned on the actuation surface 114, for example, in a radial pattern around a perimeter of the actuation surface 114.

Figure 5:
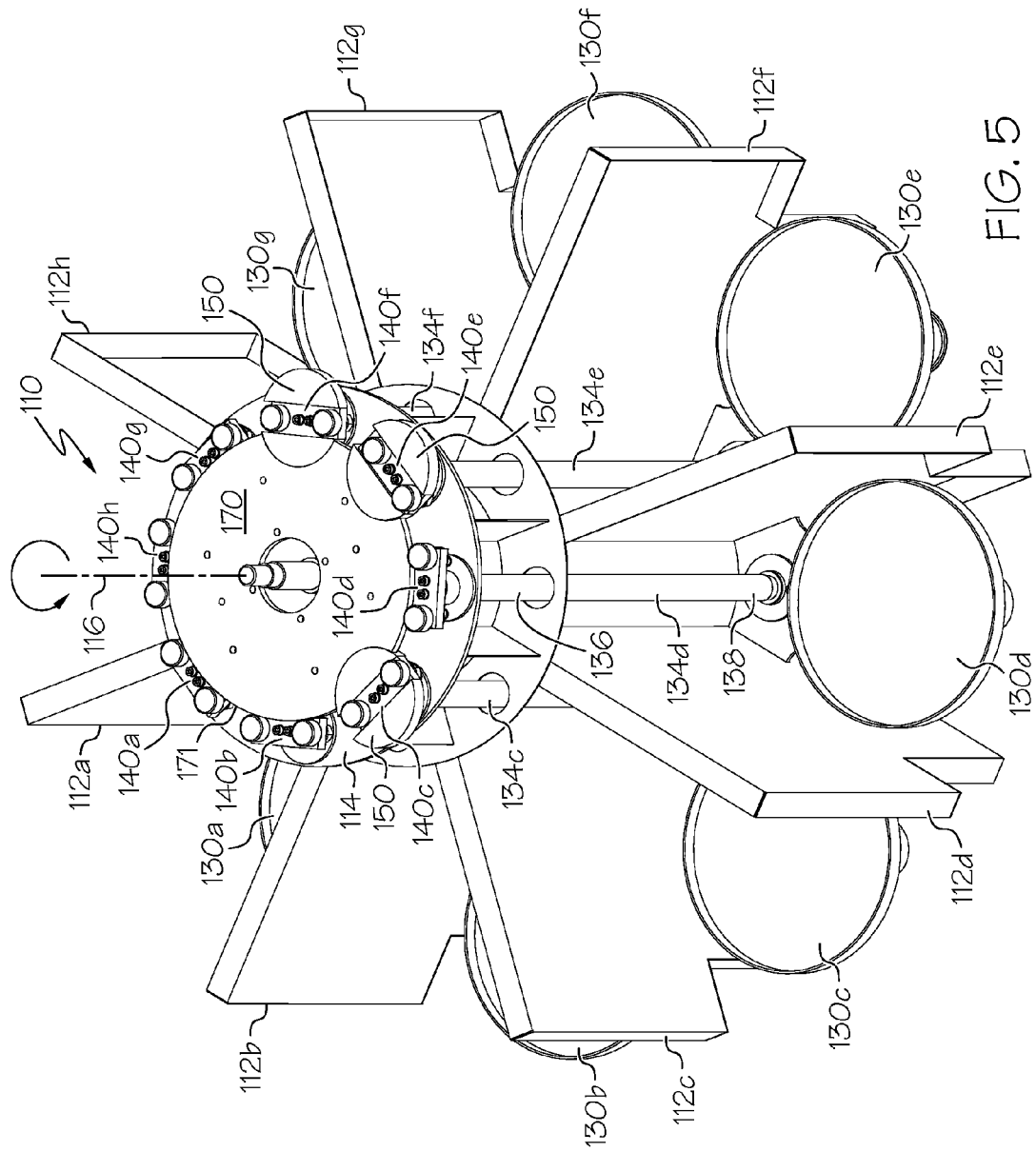
FIG. 5 is a front perspective view of a rotatable indexing assembly coupled to a drive station table and one or more slotted drive hubs of the multiple-stage processing device depicted in FIGS. 1-3 according to one or more embodiments described and illustrated herein.

Referring now to FIG. 5, the actuation surface 114 can include a plurality of holes co-located with the locations of the plurality of fixture mount assemblies 140a-140h to allow a radial stage drive shaft 134a-134h to extend through each of the holes and engage with each individual fixture mount assembly 140a-140h. By engaging with an individual radial stage drive shaft 134a-134h, the individual fixture mount assemblies 140a-140h can be positioned at a fixed location on the actuation surface 114 and can be independently rotated at that fixed location while simultaneously indexing around the axis of rotation 116. When the rotatable indexing assembly 110 rotates, the plurality of fixture mount assemblies 140a-140h are indexed about the axis of rotation 116 while each fixture mount assembly 140a-140h remains independently operable and rotatable. Further, each individual fixture mount assembly 140a-140h can independently operate each associated and mechanically coupled individual radial stage 130a-130h. As an example and not a limitation, a first radial stage 130a can be positioned between the first dividing wall 112a and the second dividing wall 112b, and can be coupled to a second end 138 of a first radial stage drive shaft 134a. The first radial stage drive shaft 134a extends though the actuation surface 114 and mechanically couples the radial stage 130a and the first fixture assembly 140a.

Figure 6:
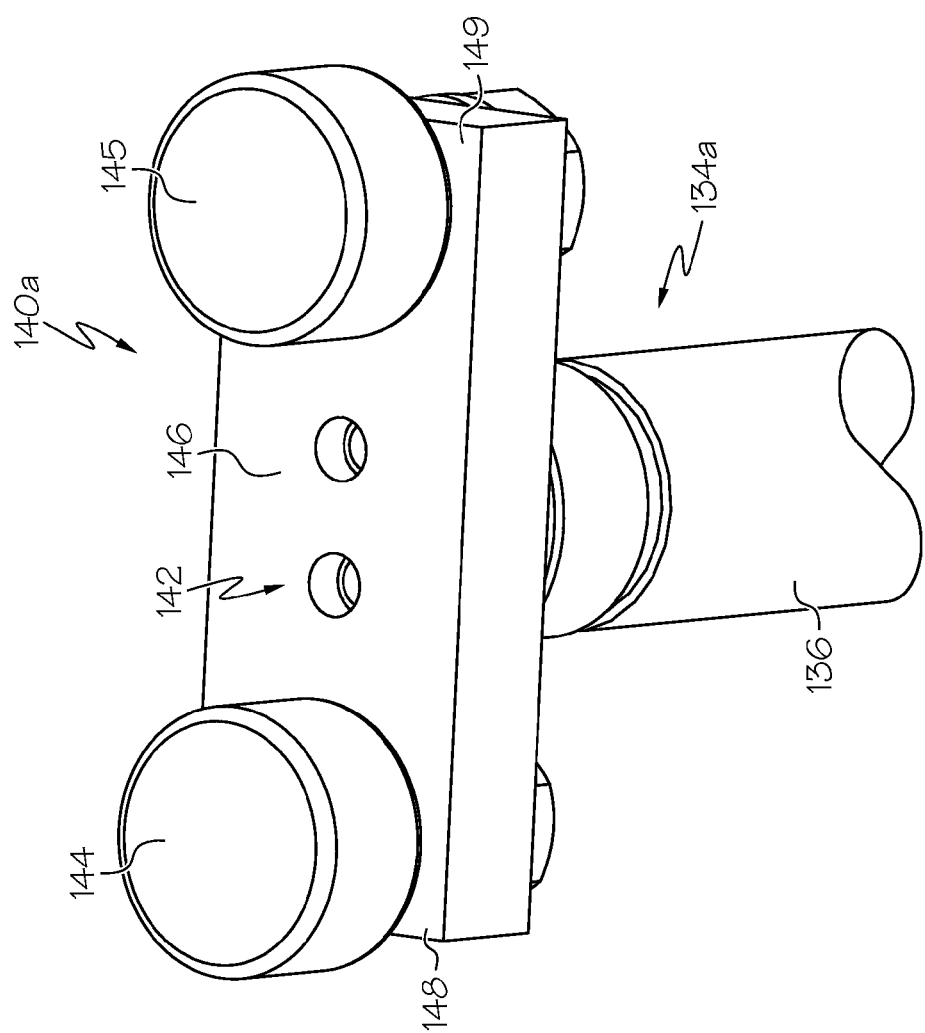
FIG. 6 is a perspective view of a fixture mount assembly of the multiple-stage processing device depicted in FIGS. 1-3 according to one or more embodiments described and illustrated herein.

Referring now to FIG. 6, an individual fixture mount assembly 140a is depicted. The individual fixture mount assembly 140a may comprise a fixture mount 142 having a central portion 146 positioned between a first side portion 148 and a second side portion 149. The central portion 146 is coupled to a first end 136 of an individual radial stage drive shaft 134a. The individual fixture mount assembly 140a also includes a first cam roller 144 positioned on the first side portion 148 and a second cam roller 145 positioned on the second side portion 149. In some embodiments, the cam rollers 144, 145 are rotatably positioned on the fixture mount 142 to allow free rotation of the cam rollers 144, 145. Alternatively, the cam rollers 144, 145 can be rigidly positioned on the fixture mount 142. It should be understood that each fixture mount assembly 140a-140h may comprise the components described above.

Referring now to FIGS. 4 and 5, one or more slotted drive hubs 150 are positioned adjacent to the actuation surface 114 of the rotatable indexing assembly 110. The one or more slotted drive hubs 150 may comprise a slot 152 having slot walls 154 extending into the slotted drive hub 150. In some embodiments, slots 152 of the one or more slotted drive hubs 150 are engageable with the one or more fixture mount assemblies 140. For example, the cam rollers 144, 145 and the fixture mount 142 can be positioned within the slot 152. In some embodiments, each cam roller 144, 145 can rotatably or slidably engage with the slot walls 154 and be positioned within with the slot 152, connecting the individual fixture mount assembly 140 with the slotted drive hub 150. When the individual fixture mount assembly 140 is disposed within the slot 152 of the slotted drive hub 150, the individual fixture mount assembly 140 and the slotted drive hub 150 are in mechanical communication such that movement of the slotted drive hub 150 moves the individual fixture mount assembly 140 and, by extension, moves the radial stage 130 attached to the individual fixture mount assembly 140. When the plurality of fixture mount assemblies 140a-140h index with the rotatable indexing assembly 110 about the axis of rotation 116, the plurality of fixture mount assembly 140a-104h can sequentially engage and disengage the one or more slotted drive hubs 150.

Figure 7:
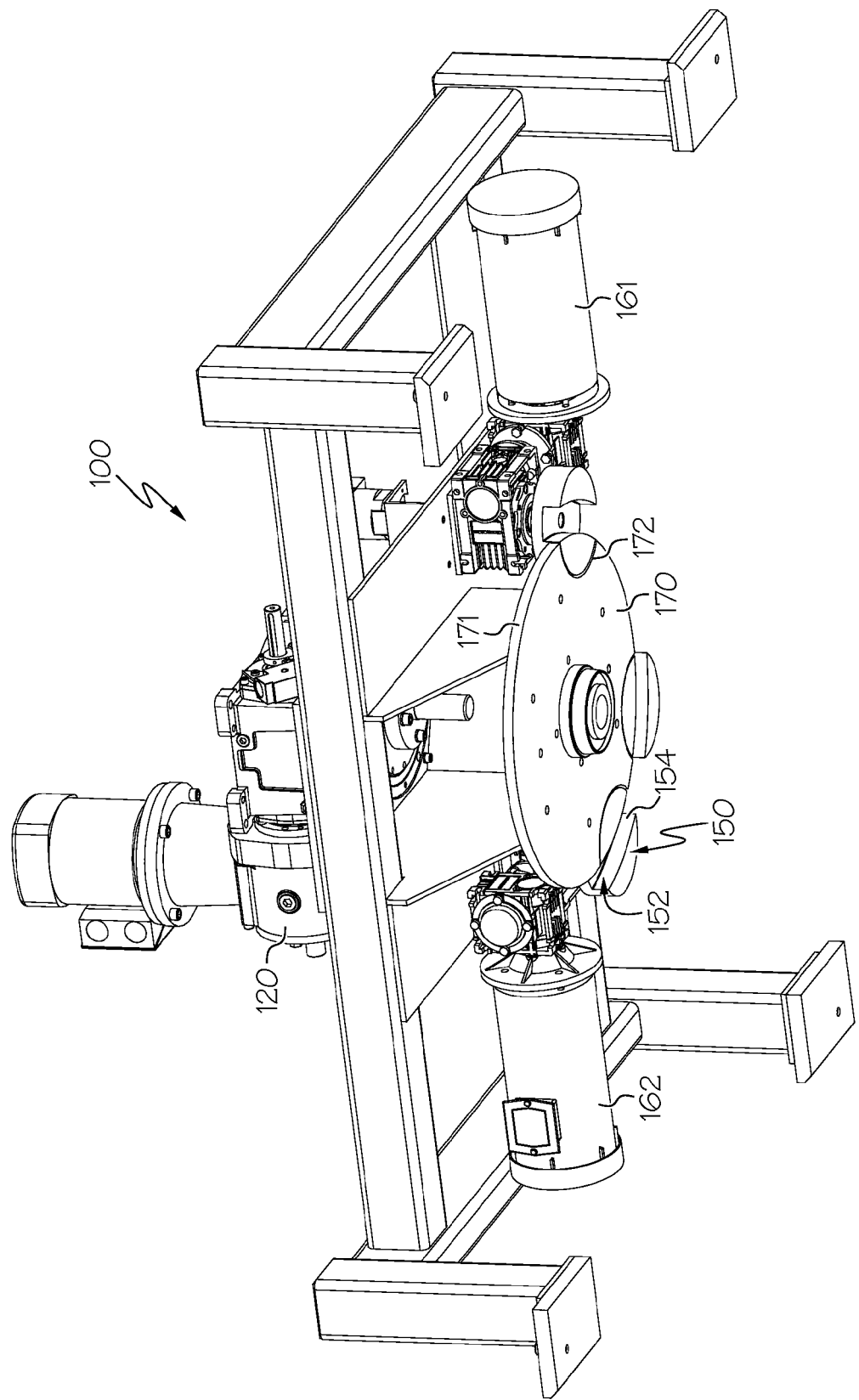
FIG. 7 is a front perspective view of a drive station table, an indexing motor, and three slotted drive hubs communicatively coupled to two independently operable drive motors of the multiple-stage processing device depicted in FIGS. 1-3 according to one or more embodiments described and illustrated herein.

Referring now to FIGS. 4 and 7, the one or more slotted drive hubs 150 are communicatively coupled to one or more independently operable drive motors (e.g., an independently operable washing station drive motor 161 and an independently operable drying station drive motor 162) comprising a gearbox and direct drive arrangement, or the like. An individual slotted drive hub 150 that is communicatively coupled to an independently operable drive motor can be controlled independently of the other slotted drive hubs 150. Accordingly, an individual fixture mount assembly 140 disposed within a slot 152 of a slotted drive hub 150 is rotated independently of the other fixture mount assemblies 140a-140h. The motion provided by the individual independently operable drive motors includes, but is not limited to, clockwise or counter-clockwise rotation, continuous rotation, discontinuous rotation, oscillation, pause, and the like. In some embodiments, as depicted in FIG. 8, two or more slotted drive hubs 150 are coupled together using a slave drive 164. The slave drive 164 can connect the two or more slotted drive hubs 150 such that any motion by one slotted drive hub 150 is performed simultaneously by each of the two or more slotted drive hubs 150 connected by the slave drive 164.

Referring now to FIGS. 4, 5, and 7, a drive station table 170 positioned adjacent the actuation surface 114 is depicted. The drive station table 170 can provide a mounting location for the one or more independently operable drive motors 161, 162 and the indexing motor 120. In some embodiments, the drive station table 170 includes a rounded outer edge 171 engageable with the cam rollers 144, 145 of the plurality of fixture mount assemblies 140a-140h. For example, as depicted in FIG. 5, the fixture mount assemblies 140a-140h are positioned radially near the perimeter of the actuation surface 114 and circumscribe the outer edge 171 of the drive station table 170. In operation, as the actuation surface 114 indexes with the rotatable indexing assembly 110 the drive station table 170 remains fixed and the cam rollers 144, 145 of the plurality of fixture mount assemblies 140a-140h roll or slide along the outer edge 171 of the drive station table 170.

Referring still to FIGS. 4, 5, and 7, the drive station table 170 includes the one or more cutout zones 172 radially positioned along a perimeter of the drive station table 170. In some embodiments, the one or more slotted drive hubs 150 can be disposed within the one or more cutout zones 172 such that the slot 152 can be aligned with the outer edge 171 of the drive station table 170 allowing the cam rollers 144, 145 rolling or sliding along the outer edge 171 of the drive station table 170 to enter and engage the slot 152 of the slotted drive hub 150. When the slot 152 is aligned with the outer edge 171 of the drive station table 170 the slotted drive hub 150 is positioned in an open configuration, for example, when the rotatable indexing assembly 110 rotates, indexing the fixture mount assemblies 140 into and out of engagement with the slotted drive hubs 150. In the open configuration, the fixture mount assemblies 140a-140h are free to index through the one or more slotted drive hubs 150. When the slot 152 is misaligned with the outer edge 171 of the drive station table 170 the slotted drive hub 150 is positioned in a closed configuration, for example, when an individual fixture mount assembly 140 is engaged with a slotted drive hub 150 and is being rotated by an independently operable drive motor. In the closed configuration, the fixture mount assemblies 140a-140h cannot index through the one or more slotted drive hubs 150.

Each independently operable drive station motor may be associated with a processing station. For example, the independently operable washing station drive motor 161 is associated with an washing station 230 and can provide the optimal motion of a component located in the washing station and the independently operable drying station drive motor 162 is associated with one or both of the first drying station 250 and the second drying station 260 and can provide optimal motion for a component located in the drying stations 250, 260. As an example and not a limitation, the independent control of each independently operable drive motor allows for a component being washed to be simultaneously moved in a pattern different from a component being dried within the multiple-stage processing device 100.

Referring again to FIGS. 2 and 3, each of the plurality of processing stations 200 are positioned radially about the axis of rotation 116 such that the radial stages 130 can be indexed through the plurality of processing stations 200. As depicted in FIGS. 2 and 3, the plurality of processing stations 200 of the illustrated example include a loading station 210, a first vestibule station 220, a washing station 230 a rinsing station 240, a first drying station 250, a second drying station 260, a second vestibule station 270, and an unloading station 280, which are described in detail below. It should be understood that while eight processing stations 200 are described, any number of processing stations 200 are contemplated. In alternative embodiments, the multiple-stage processing device 100 may comprise a single loading/unloading station, a washing station 230, and a first drying station 250, and optionally, a rinsing station 240. In some embodiments, the multiple-stage processing device 100 may not include the first vestibule station 220 or the second vestibule station 270. Further, it should be understood that while the processing stations 200 are described as being positioned in a particular indexable order, alternative embodiments of the multiple-stage processing device 100 may comprise processing stations 200 positioned in any indexable order. It should be understood that the processing stations described above can be positioned in any order and in any combination.

In some embodiments, the loading station 210 and unloading station 280 are located adjacent to each other such that an individual radial stage 130 located at the unloading station 280 can index to the loading station 210 without passing through another processing station 200. The loading station 210 and the unloading station 280 may further comprise one or more pneumatic shot pin assemblies configured to precisely locate a component on an individual radial stage 130 such that each component is located in the same position on each individual radial stage 130a-130h. By locating the component in a precise location on each individual radial stage 130a-130h, a repeatable process can be performed at each processing station to each component. In some embodiments, loading station 210 and unloading station 280 comprise a single, shared loading/unloading station. In these embodiments, loading and unloading of components can be performed at the same location.

In the embodiments depicted in FIGS. 2 and 3, a first vestibule station 220 and a second vestibule station 270 are provided. The first vestibule station 220 and the second vestibule station 270 may be located in any position within the multiple stage processing device 100. For example, as depicted in FIGS. 2 and 3, the first vestibule station 220 is positioned between the loading station 210 and the washing station 230 and the second vestibule station 270 is positioned between the second drying station 260 and the unloading station 280. The first vestibule station 220 and second vestibule station 270 can provide a location for preparing components to enter an adjacent processing station. It should be understood that any number of vestibule stations can be positioned at any location throughout the multiple-stage processing device 100.

In the embodiments depicted in FIGS. 2 and 3, a washing station 230 is positioned between the first vestibule station 220 and the rinsing station 240. It should be understood that the washing station 230 may be positioned in any location throughout the multiple-stage processing device 100. The washing station 230 may comprise a plurality of washing nozzles configured to provide high impact sprays of cleaning solution directed at the component located in the washing station 230. The washing station 230 may further comprise a liquid collection region fluidly coupled to one or more recirculation pumps. The one or more recirculation pumps are fluidly coupled to one or more solution filters configured to remove contaminants and debris from the cleaning solution. Once the cleaning solution has passed through the one or more solution filters, it can be recirculated to the washing station 230 and directed through the plurality of washing nozzles. In some embodiments, the recirculation pumps circulate cleaning solution from more than one processing station 200, for example the washing station 230 and the rinsing station 240.

In the embodiments depicted in FIGS. 2 and 3, the rinsing station 240 is positioned between the washing station 230 and the first drying station 250. The rinsing station 240 may comprise one or more rinsing nozzles configured to spray rinsing fluid directed towards a radial stage 130 positioned within the washing station 230. The rinsing nozzles may be programmable such that the rinsing nozzles can spray a variable pressure and volume of rinsing fluid. The rinsing station 240 may also include a liquid collection region fluidly coupled to one or more recirculation pumps and solution filters to clean and recirculate the rinsing fluid.

In the embodiments depicted in FIGS. 2 and 3, a first drying station 250 and a second drying station 260 are positioned radially adjacent between the rinsing station 240 and the second vestibule station 270. The first drying station 250 and the second drying station 260 may comprise one or more blowers, for example regenerative blowers, or the like, fluidly coupled to one or more drying nozzles, such as, for example, one or more air knives. The one or more regenerative blowers can generate high velocity air that can be expelled through the one or more air knives to provide drying by high pressure-high velocity heated air jets. The blowers are programmable to provide air jets having a variable pressure, velocity, and temperature. While FIGS. 2 and 3 depict a first drying station 250 and a second drying station 260, it should be understood that embodiments may only include a single drying station or may include more than two drying stations.

Referring still to FIGS. 2 and 3, operation of the multiple stage processing device 100 will now be described in more detail. The plurality of radial stages 130 that are coupled to the rotatable indexing assembly 110 can be rotated about the axis of rotation 116 of the rotatable indexing assembly 110, thereby indexing the individual radial stages 130 through the plurality of processing stations 200 to subject the components being processed to different processing functions within the multiple-stage processing device 100. It should be understood each of the steps described below with respect to the first individual radial stage 130a can occur simultaneously at the respective processing stations to each individual radial stage 130a-130h. For example, in the embodiments depicted in FIGS. 2 and 3, when the first individual radial stage 130a is positioned at the loading station 210, the second individual radial stage 130b is positioned at a first vestibule station 220, and the third individual radial stage 130c is positioned at the washing station 230.

In operation, a component is manually or robotically loaded into a first individual radial stage 130a positioned at loading station 210 and optionally contacted by a pneumatic shot pin assembly to precisely locate the component on the first individual radial stage 130a. Next, the rotatable indexing assembly 110 is rotated, indexing the first individual radial stage 130a to the first vestibule station 220.

The rotatable indexing assembly 110 is rotated again, indexing the first individual radial stage 130a into the washing station 230 and indexing the fixture mount assembly 140a connected to the first individual radial stage 130a into engagement with the slotted drive hub 150 associated with the independently operable washing station drive motor 161. At the washing station 230, the independently operable washing station drive motor 161 provides rotational motion to the first individual radial stage 130a while the washing nozzles simultaneously direct cleaning solution at the component positioned on the first individual radial stage 130a. The independent control of the first individual radial stage 130a allows jets of cleaning solution to be strategically directed into bores or other difficult to reach spaces of the component being washed.

Next, the rotatable indexing assembly 110 indexes the first individual radial stage 130a into the rinsing station 240 moving the fixture mount assembly 140a connected to the first individual radial stage 130a into engagement with the slotted drive hub 150 associated with a rinsing station independently operable drive motor (not pictured). At the rinsing station 240, the rinsing station independently operable drive motor provides rotational motion to the first individual radial stage 130a while the rinsing nozzles simultaneously direct rinsing solution at the component positioned on the first individual radial stage 130a. The independent control of the first individual radial stage 130a allows jets of rinsing solution to be strategically directed into bores or other difficult to reach spaces of the component being rinsing. In alternative embodiments, the rinsing station 240 does not include an associated slotted drive hub 150 and the first individual radial stage 130a can be rinsed without being independently rotated.

The rotatable indexing assembly 110 is rotated again, indexing the first individual radial stage 130a into the first drying station 250 and indexing the fixture mount assembly 140 connected to the first individual radial stage 130a into engagement with the slotted drive hub 150 associated with an independently operable drying station drive motor 162. At the first drying station 250, the independently operable drying station drive motor 162 provides rotational motion to the first individual radial stage 130a while the drying nozzles fluidly coupled to the blower simultaneously direct jets of air at the component positioned on the first individual radial stage 130a. The independent control of the first individual radial stage 130a allows jets of air to be strategically directed into bores or other difficult to reach spaces of the component being dried.

Next, the rotatable indexing assembly 110 indexes the first individual radial stage 130a into the second drying station 260. This moves the fixture mount assembly 140 connected to the first individual radial stage 130a into engagement with the slotted drive hub 150 coupled by a slave drive 164 to the slotted drive hub 150 associated with the second independently operable drying station drive motor 162. At the second drying station 260, the independently operable drying station drive motor 162 provides rotational motion to the first individual radial stage 130a while the drying nozzles fluidly coupled to the blower simultaneously direct jets of air at the component positioned on the first individual radial stage 130a. The independent control of the first individual radial stage 130a allows jets of air to be strategically directed into bores or other difficult to reach spaces of the component being dried. Further, the slave drive 164 couples together the slotted drive hubs 150 associated with the first drying station 250 and the second drying station 260 such that any motion by one slotted drive hub 150 is performed simultaneously by the other slotted drive hubs 150 connected by the slave drive 164. In some embodiments, a slave drive 164 is not included and the second drying station 260 can be coupled to an independently operable drive motor 161, 162 providing independent motion to the slotted drive hub 150.

Next, the rotatable indexing assembly 110 indexes the first individual radial stage 130a to the second vestibule station 270 followed by the first individual radial stage 130a to the unloading station where the component is manually or robotically unloaded from the first individual radial stage 130a. It should be understood that each of the processing stations 200 described above may operate simultaneously such that a component can be positioned on each radial stage 130a-130h and independently processed. Further, the independent control of each radial stage 130a-130h positioned in each processing station 200 allows for one component to be washed while the others are simultaneously rinsed, dried, loaded, unloaded, and the like.

In alternative embodiments, the individual radial stages 130a-130h can be communicatively and/or mechanically coupled directly to a radial stage drive motor programmed to provide the movements associated with each processing station when the individual radial stage 130a-130h is positioned in that particular processing station 200. Accordingly, the radial stage drive motor may be programmed to move the individual radial stage 130a differently depending on which processing station 200 the individual radial stage 130a-130h is currently located. For example, the optimal motion of the individual radial stage 130a-130h in the washing station 230 may be different from the optimal motion of the individual radial stage 130a-130h in the first drying station 250. As an example and not a limitation, the independent control of each individual radial stage 130a-130h allows for a component being washed to be simultaneously moved in a pattern different from a component being dried within the multiple-stage processing device 100.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A multiple stage processing device comprising:
   a rotatable indexing assembly comprising a plurality of dividing walls extending radially from an axis of rotation;
   an indexing motor communicatively coupled to the rotatable indexing assembly;
   a plurality of radial stages, each individual radial stage positioned between adjacent dividing walls of the plurality of dividing walls, wherein each individual radial stage is indexable though a plurality of processing stations;
   a plurality of fixture mount assemblies, each individual fixture mount assembly positioned on an actuation surface of the rotatable indexing assembly, each individual fixture mount assembly associated with and mechanically coupled to an individual radial stage;
   two or more slotted drive hubs positioned adjacent to the actuation surface of the rotatable indexing assembly, the two or more slotted drive hubs engageable with the plurality of fixture mount assemblies; and
   two or more independently operable drive motors, wherein each independently operable drive motor is communicatively coupled to one of the two or more slotted drive hubs, wherein when an individual fixture mount assembly is engaged with an individual slotted drive hub, the individual slotted drive hub and an individual independently operable drive motor can independently control the individual fixture mount assembly such that the individual radial stage associated with and mechanically coupled to the individual fixture mount assembly is moveably coupled to the individual independently operable drive motor.

2. The multiple stage processing device of claim 1, wherein each individual fixture assembly comprises one or more cam rollers rotatably engageable with a slot of each individual slotted drive hub.

3. The multiple stage processing device of claim 1 further comprising a drive station table positioned adjacent to the actuation surface of the rotatable indexing assembly, the drive station table comprising a plurality of cutout zones, wherein the two or more slotted drive hubs are positioned within the plurality of cutout zones.

4. The multiple stage processing device of claim 1, wherein the two or more slotted drive hubs are coupled together with a slave drive.

5. The multiple stage processing device of claim 1 further comprising a plurality of radial stage drive shafts, wherein each individual radial stage drive shaft is coupled to an individual fixture mount assembly at a first end of the individual radial stage drive shaft and coupled to an individual radial stage at a second end of the individual radial stage drive shaft.

6. The multiple stage processing device of claim 1, wherein the two or more slotted drive hubs comprise an open configuration and a closed configuration, wherein when the two or more slotted drive hubs are in the open configuration, the plurality of fixture mount assemblies are free to index through the two or more slotted drive hubs.

7. The multiple stage processing device of claim 6, wherein when the two or more slotted drive hubs are in the closed configuration, the plurality of fixture mount assemblies cannot index through the two or more slotted drive hubs.

8. The multiple stage processing device of claim 1, wherein at least one of the plurality of processing stations comprises a loading station.

9. The multiple stage processing device of claim 1, wherein at least one of the plurality of processing stations comprises a washing station, the washing station comprising a plurality of washing nozzles configured to direct cleaning solution at the individual radial stage positioned within the washing station.

10. The multiple stage processing device of claim 1, wherein at least one of the plurality of processing stations comprises a drying station, the drying station comprising a plurality of drying nozzles fluidly coupled to a blower configured to generate and direct air at the individual radial stage positioned within the drying station.

11. A multiple stage processing device comprising:
    a rotatable indexing assembly comprising a plurality of dividing walls extending radially from an axis of rotation;
    an indexing motor communicatively coupled to the rotatable indexing assembly;
    a plurality of radial stages, each individual radial stage positioned between adjacent dividing walls of the plurality of dividing walls, wherein each individual radial stage is indexable though a plurality of processing stations;
    a plurality of fixture mount assemblies, each individual fixture mount assembly positioned on an actuation surface of the rotatable indexing assembly, each individual fixture mount assembly associated with and mechanically coupled to an individual radial stage;
    one or more slotted drive hubs positioned adjacent to the actuation surface of the rotatable indexing assembly, the one or more slotted drive hubs engageable with the plurality of fixture mount assemblies; and one or more independently operable drive motors communicatively coupled to the one or more slotted drive hubs, wherein when an individual fixture mount assembly is engaged with an individual slotted drive hub, the individual slotted drive hub and an individual independently operable drive motor can independently control the individual fixture mount assembly such that the individual radial stage associated with and mechanically coupled to the individual fixture mount assembly is moveably coupled to the individual independently operable drive motor and at least one of the one or more independently operable drive motor operates two or more slotted drive hubs, the two or more slotted drive hubs coupled together with a slave drive.

12. The multiple stage processing device of claim 11, wherein each individual fixture assembly comprises one or more cam rollers rotatably engageable with a slot of each individual slotted drive hub.

13. The multiple stage processing device of claim 11 further comprising a plurality of radial stage drive shafts, wherein each individual radial stage drive shaft is coupled to an individual fixture mount assembly at a first end of the individual radial stage drive shaft and coupled to an individual radial stage at a second end of the individual radial stage drive shaft.

14. The multiple stage processing device of claim 11, wherein:
the two or more slotted drive hubs comprise an open configuration and a closed configuration;
when the two or more slotted drive hubs are in the open configuration, the plurality of fixture mount assemblies are free to index through the two or more slotted drive hubs; and
when the two or more slotted drive hubs are in the closed configuration, the plurality of fixture mount assemblies cannot index through the two or more slotted drive hubs.

15. The multiple stage processing device of claim 11, wherein:
at least one of the plurality of processing stations comprises a loading station;
at least one of the plurality of processing stations comprises a washing station, the washing station comprising a plurality of washing nozzles configured to direct cleaning solution at the individual radial stage positioned within the washing station; and
at least one of the plurality of processing stations comprises a drying station, the drying station comprising a plurality of drying nozzles fluidly coupled to a blower configured to generate and direct air at the individual radial stage positioned within the drying station.

16. A multiple stage processing device comprising:
a rotatable indexing assembly comprising a plurality of dividing walls extending radially from an axis of rotation;
an indexing motor communicatively coupled to the rotatable indexing assembly;
a plurality of radial stages, each individual radial stage positioned between adjacent dividing walls of the plurality of dividing walls, wherein each individual radial stage is indexable though a plurality of processing stations;
a plurality of fixture mount assemblies, each individual fixture mount assembly positioned on an actuation surface of the rotatable indexing assembly, each individual fixture mount assembly associated with and mechanically coupled to an individual radial stage;
one or more slotted drive hubs engageable with the plurality of fixture mount assemblies, the one or more slotted drive hubs each comprising slot walls extending into a body of the slotted drive hub thereby forming a slot extending through the body of the slotted drive hub along a plane parallel to a plane of rotation of the rotatable indexing assembly; and
one or more independently operable drive motors communicatively coupled to the one or more slotted drive hubs, wherein when an individual fixture mount assembly is engaged with an individual slotted drive hub, the individual slotted drive hub and an individual independently operable drive motor can independently control the individual fixture mount assembly such that the individual radial stage associated with and mechanically coupled to the individual fixture mount assembly is moveably coupled to the individual independently operable drive motor.

17. The multiple stage processing device of claim 16, wherein each individual fixture assembly comprises one or more cam rollers rotatably engageable with a slot of each individual slotted drive hub.

18. The multiple stage processing device of claim 16 further comprising a plurality of radial stage drive shafts, wherein each individual radial stage drive shaft is coupled to an individual fixture mount assembly at a first end of the individual radial stage drive shaft and coupled to an individual radial stage at a second end of the individual radial stage drive shaft.

19. The multiple stage processing device of claim 16, wherein:
the one or more slotted drive hubs comprise an open configuration and a closed configuration;
when the one or more slotted drive hubs are in the open configuration, the plurality of fixture mount assemblies are free to index through the one or more slotted drive hubs; and
when the one or more slotted drive hubs are in the closed configuration, the plurality of fixture mount assemblies cannot index through the one or more slotted drive hubs.

20. The multiple stage processing device of claim 16, wherein:
at least one of the plurality of processing stations comprises a loading station;
at least one of the plurality of processing stations comprises a washing station, the washing station comprising a plurality of washing nozzles configured to direct cleaning solution at the individual radial stage positioned within the washing station; and
at least one of the plurality of processing stations comprises a drying station, the drying station comprising a plurality of drying nozzles fluidly coupled to a blower configured to generate and direct air at the individual radial stage positioned within the drying station.

* * * * *